United States Patent
Park

(10) Patent No.: US 8,568,012 B2
(45) Date of Patent: Oct. 29, 2013

(54) LIGHTING UNIT AND DISPLAY DEVICE HAVING THE SAME

(75) Inventor: Joo Hyang Park, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 36 days.

(21) Appl. No.: 13/006,748

(22) Filed: Jan. 14, 2011

(65) Prior Publication Data

US 2011/0199788 A1    Aug. 18, 2011

(30) Foreign Application Priority Data

Jan. 18, 2010  (KR) .................. 10-2010-0004523
Mar. 25, 2010  (KR) .................. 10-2010-0026873

(51) Int. Cl.
*F21V 7/04* (2006.01)
*G09F 13/04* (2006.01)
*G09F 13/08* (2006.01)

(52) U.S. Cl.
USPC ......... 362/612; 362/97.1; 362/97.3; 362/607; 362/616

(58) Field of Classification Search
USPC ............... 362/612, 632–634, 607, 616, 97.3, 362/97.1–97.4
See application file for complete search history.

(56) References Cited

U.S. PATENT DOCUMENTS

| | | | |
|---|---|---|---|
| 6,930,332 B2 * | 8/2005 | Hashimoto et al. | 257/98 |
| 6,942,360 B2 | 9/2005 | Chou et al. | |
| 6,946,714 B2 * | 9/2005 | Waitl et al. | 257/434 |
| 6,969,189 B2 * | 11/2005 | Lee et al. | 362/631 |
| 7,431,477 B2 * | 10/2008 | Chou et al. | 362/240 |
| 8,017,969 B2 * | 9/2011 | Wang et al. | 257/99 |
| 8,026,526 B2 * | 9/2011 | Weber-Rabsilber et al. | 257/95 |
| 8,104,909 B2 * | 1/2012 | Shin | 362/97.1 |
| 8,147,092 B2 * | 4/2012 | Wu et al. | 362/231 |
| 8,157,410 B2 * | 4/2012 | Park | 362/240 |
| 2005/0045897 A1 | 3/2005 | Chou et al. | 257/98 |
| 2006/0146563 A1 | 7/2006 | Chen | 362/561 |
| 2006/0268567 A1 | 11/2006 | Jang et al. | 362/555 |
| 2007/0090382 A1 * | 4/2007 | Ryu | 257/98 |
| 2007/0103939 A1 * | 5/2007 | Huang et al. | 362/633 |
| 2008/0316741 A1 | 12/2008 | Lee | 362/231 |
| 2009/0135331 A1 | 5/2009 | Kawase | 349/58 |
| 2009/0141476 A1 * | 6/2009 | Meir et al. | 362/84 |
| 2009/0213296 A1 | 8/2009 | Park et al. | 349/62 |
| 2009/0237916 A1 * | 9/2009 | Park | 362/97.1 |
| 2009/0268434 A1 * | 10/2009 | Mita et al. | 362/97.1 |

FOREIGN PATENT DOCUMENTS

| | | |
|---|---|---|
| CN | 201284988 | 8/2009 |
| JP | 2002-049326 A | 2/2002 |
| JP | 03-471665 B2 | 9/2003 |
| JP | 2007-042320 A | 2/2007 |

(Continued)

OTHER PUBLICATIONS

Korean Office Action dated Feb. 10, 2011.

(Continued)

*Primary Examiner* — David J Makiya
(74) *Attorney, Agent, or Firm* — KED & Associates LLP

(57) ABSTRACT

Provided are a lighting unit and a display device including the same. The lighting unit includes a bottom cover having a plurality of sidewalls, light emitting modules each including a board disposed on the bottom cover and a plurality of light emitting diodes mounted on the board, and a light-transmitting resin layer covering the bottom cover and the board.

20 Claims, 9 Drawing Sheets

(56) References Cited

FOREIGN PATENT DOCUMENTS

| | | |
|---|---|---|
| JP | 2007-059758 A | 3/2007 |
| JP | 2008-123969 A | 5/2008 |
| JP | 2009-150981 A | 7/2009 |
| JP | 2009-260174 A | 11/2009 |
| KR | 10-2006-0040502 A | 5/2006 |
| KR | 10-2007-0109125 A | 11/2007 |
| KR | 10-2008-0021993 A | 3/2008 |
| KR | 10-2009-0032620 A | 4/2009 |
| KR | 10-2009-0059877 A | 6/2009 |
| KR | 10-2009-0073452 A | 7/2009 |
| WO | WO 2008/018709 A1 | 2/2008 |
| WO | WO 2009/002081 A2 | 12/2008 |
| WO | WO 2010/058961 A2 | 5/2010 |

OTHER PUBLICATIONS

Korean Office Action dated Feb. 10, 2011 issued in Application No. 10-2010-0004523.
European Search Report dated Aug. 8, 2011 issued in Application No. 11 15 1310.
Chinese Office Action dated Sep. 11, 2012.

* cited by examiner

US 8,568,012 B2

LIGHTING UNIT AND DISPLAY DEVICE HAVING THE SAME

CROSS-REFERENCE TO RELATED APPLICATIONS

The present application claims priority under 35 U.S.C. §119(a) of Korean Patent Application No. 10-2010-0004523 filed on Jan. 18, 2010 and 10-2010-026873 filed on Mar. 25, 2010, which is hereby incorporated by reference in its entirety.

BACKGROUND

Embodiments relate to a lighting unit and a display device having the same.

With the development of the electronic device industry, a variety of display devices that are small-sized and have relatively low energy consumption has being developed. One of the display devices is a liquid crystal display (LCD) device that has been widely used as a display unit for a monitor, a television, and a mobile communication terminal.

Since the LCD device is not a self-luminous device, a backlight unit used as a light source for emitting light toward a rear surface of an LCD panel is provided generally. The backlight unit emits white light so that the liquid crystal panel can reproduce the real color of the image.

SUMMARY

Embodiments provide a lighting unit having a new structure and a display device having the same.

Embodiments provide a light unit including a light-transmitting resin layer on a light emitting module and a bottom cover and a display device having the same.

In one embodiment, a lighting unit includes: a bottom cover having a plurality of sidewalls; a light emitting module including a board disposed on the bottom cover and a plurality of light emitting diodes mounted on the board; and a light-transmitting resin layer covering the bottom cover and the board.

In another embodiment, a lighting unit includes: a bottom cover having a sidewall and a recess portion within the sidewall; a plurality of light emitting modules each including a plurality of light emitting diodes disposed in the recess portion of the bottom cover; a resin layer covering each of the light emitting modules; and an optical sheet disposed on the light emitting modules.

In further another embodiment, a display device includes: a lighting unit including a bottom cover having a plurality of sidewalls, a light emitting module including a board disposed on the bottom cover and a plurality of light emitting diodes mounted on the board, and a light-transmitting resin layer covering the light emitting module and the bottom cover; and a display panel on the lighting unit.

The details of one or more embodiments are set forth in the accompanying drawings and the description below. Other features will be apparent from the description and drawings, and from the claims.

DETAILED DESCRIPTION OF THE EMBODIMENTS

Figure 1:
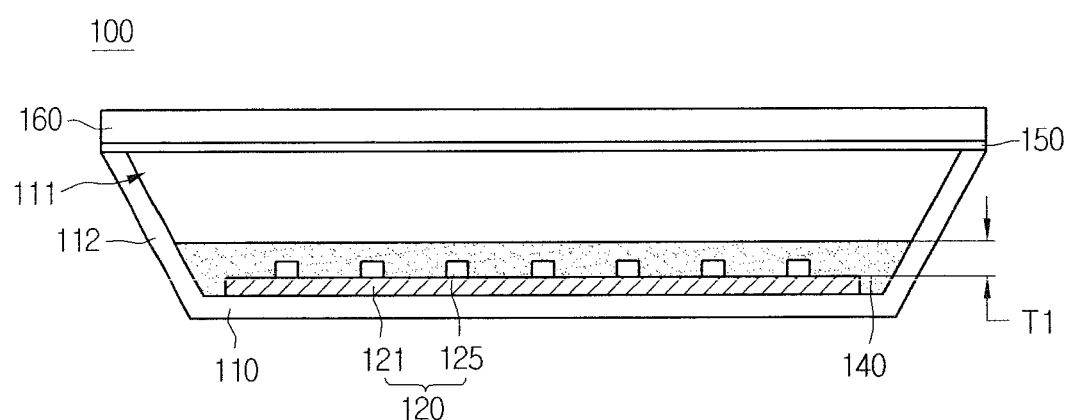
FIG. 1 is a sectional view of a display device according to a first embodiment.

In the description of embodiments, it will be understood that when a layer (or film), region, pattern or structure is referred to as being 'on' another layer (or film), region, pad or pattern, the terminology of 'on' and 'under' includes both the meanings of 'directly' and 'indirectly'. Further, the reference about 'on' and 'under' each layer will be made on the basis of drawings.

In the drawings, the thickness or size of each layer is exaggerated, omitted, or schematically illustrated for convenience in description and clarity. Also, the size of each element does not entirely reflect an actual size.

FIG. 1 is a sectional view of a display device according to a first embodiment.

Referring to FIG. 1, a display device 100 includes a bottom cover 110, light emitting modules 120, a resin layer 140, an optical sheet 150, and a display panel 160.

The bottom cover 110 may be formed of a metallic material. For example, the bottom cover 110 may be formed of one of Al, Mg, Zn, Ti, Ta, Hf, and Nb. The bottom cover may be formed of a nonmetallic material having superior thermal conductivity, but is not limited thereto.

The plurality of light emitting modules 120 are arranged on the bottom cover 110. The plurality of light emitting modules 120 may be arranged in an M×N matrix (M>1, N>1) on a bottom surface of the bottom cover 110.

The bottom cover 110 includes a recess portion 111. The recess portion 111 has at least opened upper side and a concave groove or recessed shape. The bottom cover 110 may have the bottom surface having a flat plane shape, a stepped structure, or a groove structure. The resin layer 140 is filled into the stepped structure or the groove structure to enhance a bonding force of the resin layer 140.

A sidewall 112 is disposed around the recess portion 111 of the bottom cover 110. The sidewall 112 may be disposed on at least side of the recess portion 111. The sidewall 112 may be disposed in all side directions of the recess portion 111. The sidewall 112 may have a height at least greater than that of the resin layer 140.

The sidewall 112 of the bottom cover 110 may be inclinedly or vertically disposed with respect to the bottom surface of the bottom cover 110. Also, the sidewall 112 has a different material from the bottom cover and be assembled to the bottom cover 110, but is not limited thereto. A reflective material, e.g., a metal material such as Ag or Al may be coated on an inner surface of the bottom cover 110.

The light emitting module 120 includes a board 121 and a plurality of light emitting diodes 125. The board 121 may include one of a printed circuit board (PCB) of single layer structure, PCB of a multi-layer structure, a ceramic board, and a metal core PCB. A predetermined wiring pattern (not shown) or plated pattern may be disposed on the board 121 to supply a power, but is not limited thereto. The board 121 may include a rigid board or a flexible board.

The plurality of light emitting diodes 125 may be mounted on the board 121. The light emitting diodes 125 may be mounted on the board 121 in a chip of board (COB) type or a package of board (POB) type. In the current embodiment, a structure in which the light emitting diodes 125 are mounted on the POB type will be described as an example.

The board 121 may have an upper portion having a flat plane shape or a plurality of cavities (not shown). At least one light emitting diode 125 and the light-transmitting resin material may be disposed inside the cavities. Hereinafter, for convenience of description, the board 121 having the flat upper portion will be described as an example.

The plurality of light emitting diodes 125 may be arranged on the board 121 in a transverse direction and/or in a longitudinal direction to form an array structure. Alternatively, the plurality of light emitting diodes 125 may be arranged in a matrix or zigzag shape, and this arrangement shape may be changed according to a size of the board 121.

The plurality of light emitting diodes 125 may be arranged on the board 121 with a predetermined distance, but is not limited thereto.

A reflective layer may be disposed on a top surface of the board 121 in a region except that the light emitting diodes 125 are disposed. For example, a white photo solder resist (PSR) ink or a reflective material such as Ag or Al may be coated on the top surface of the board 121. The reflective layer may reflect incident light.

The plurality of light emitting diodes 125 may be connected to each other in series or in parallel. Such the circuit connection may be changed according to a circuit pattern or a driving manner.

Each of the light emitting diodes 125 may include at least one of a blue LED, a green LED, a red LED, and an ultraviolet (UV) LED. Hereinafter, for convenience of description, the light emitting diode including the blue LED that emits blue light or a white LED will be described as an example. The light emitting diodes 125 may be disposed with a multi-rank having wavelength different from each other in the same color band. The multi-rank may be disposed so that a target color is displayed through color mixing of two light emitting diodes 125 at least adjacent to each other. In this case, yield of the light emitting diodes may be improved.

A light-transmitting resin layer 140 (hereinafter, referred to as a resin layer) covers the bottom surface of the bottom cover 110. The resin layer 140 has an area greater than a region of the light emitting module. The resin layer 140 covers the board 121. The resin layer 140 is formed by filling the recess portion 111 of the bottom cover 110. A portion of the resin layer 140 contacts with the bottom surface of the bottom cover 112. A portion of the resin layer 140 may contact with a bottom surface between the boards 121 and a bottom surface between the board 121 and the sidewall 112 of the bottom cover 110. Also, at least one hole may be defined in the board 121, and the resin layer 140 may be filled into the hole. Thus, the resin layer 140 fixes the board 121 to the bottom surface of the bottom cover 110.

The resin layer 140 may be formed of a transparent resin such as silicon or epoxy. The resin layer 140 may have a predetermined thickness to improve light efficiency and light distribution. For example, the resin layer 140 may have a thickness T1 of about 100 μm or more from a top surface of the board. Alternatively, the resin layer 140 may have a thickness greater than that of the light emitting module 120.

The resin layer 140 has an area greater than that of the bottom surface of the bottom cover 110 to cover the entire region of the light emitting module 120.

At least one kind of phosphor may be added to the resin layer 140. For example, at least one of a red phosphor, a green phosphor, a blue phosphor may be added to the resin layer 140. The phosphor may be formed of one of YAG, TAG, silicate, nitride, and an oxynitride-based material, but is not limited thereto.

A diffuser may be added to the resin layer 140. The diffuser diffuses incident light. Thus, the resin layer 140 emits planar light from a surface thereof.

Since the resin layer 140 covers the entire surface of the board 121, it may prevent a copper foil pattern exposed to the surface of the board 121 from being oxidized or prevent moisture from being permeated.

An outer portion of the resin layer 140 may contact at least one sidewall 112 or all sidewalls 112 of the bottom cover 110. The resin layer 140 may contact the top surface and a side surface of the board 121. Also, at least portion of the resin layer 140 may extend up to a portion of a bottom surface of the board 121.

Here, the resin layer 140 is molded on the board 121. However, a portion of the resin layer 140 may be disposed under the board 121, or an adhesive or a coupling unit may be provided to attach the board 121 to the bottom surface of the bottom cover 110.

The resin layer 140 may have a flat top surface. A light transmittance may be adjusted according to a thickness and material of the resin layer 140. The thickness and material of the resin layer 140 may be changed within a technical range of the present embodiment.

In the current embodiment, the optical sheet 150 may include a photo luminescent film (PLF). The PLF may be disposed between the resin layer 140 and a diffusion sheet or a prism sheet. The PLF converts a portion of light emitted from the light emitting diode 125 into light having a different wavelength. Alternatively, the PLF may be disposed between the optical sheet 150 and the display panel 160, but is not limited thereto. The optical sheet 150 may be defined as an optical member.

The optical sheet 150 is disposed on the bottom cover 110 and includes at least one sheet of optical sheet 150. The optical sheet 150 may be spaced apart from or closely attached to the resin layer 140. The optical sheet 150 may be supported by a sheet support protrusion. The optical sheet 150 may include one of a diffusion sheet, a prism sheet, and a brightness enhanced sheet. The diffusion sheet diffuses light emitted from the light emitting diode 125, and the prism sheet guides the diffused light to a light emitting region. Here, the brightness enhanced sheet enhances brightness.

The bottom cover 110, the light emitting module 120, and the resin layer 140 serve as a lighting unit. The lighting unit provides target light, e.g., light required for the display panel 160. The lighting unit may realize local dimming according to a driving method of the plurality of light emitting modules 120, but is not limited thereto.

The display panel (e.g., LCD panel) 160 is disposed on the optical sheet to display information using light emitted from the optical sheet 150. For example, the display panel 160 may be realized by face-attaching a pair of boards, which face to each other with a liquid crystal layer therebetween, to each other. An array direction of liquid crystal molecules is artificially adjusted according to an intensity of an electric field between two transparent electrodes of the liquid crystal panel to change the light transmittance. A polarizer may be disposed on a surface or both surfaces of the display panel 160, but the embodiment is not limited thereto.

The resin layer 140 may be molded using a dispenser. Alternatively, an injection molding structure may be disposed over the bottom cover 110 to inject a resin. The resin layer 140 may be molded on the light emitting module 120 with a uniform thickness to improve the light distribution. Also, an air gap between the board 121 and the light emitting diode 125 may be removed to improve light extraction efficiency.

Also, since the resin layer 140 is molded on the bottom cover 110 and the board 121, it may be unnecessary for a coupling member for separately fixing the board 121 of the light emitting module 120, e.g., a hook member.

Figure 2:
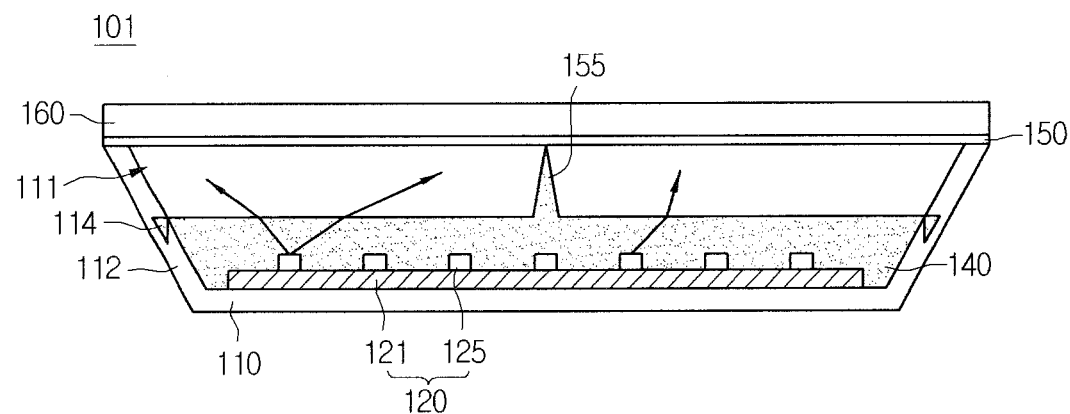
FIG. 2 is a sectional view of a display device according to a second embodiment.

FIG. 2 is a sectional view of a display device according to a second embodiment. In description of a second embodiment, the same construction as that of first embodiment will be described with reference to the first embodiment, and their duplicated descriptions will be omitted.

Referring to FIG. 2, a display device 101 includes a sheet support protrusion 155 on a resin layer 140. The sheet support protrusion 155 may protrude by a predetermined height from the resin layer 140, e.g., up to a height of a bottom cover 110. The sheet support protrusion 155 supports an optical sheet 150 to prevent the optical sheet 150 from drooping down. The sheet support protrusion 155 may be provided in plurality, and the plurality of sheet support protrusions 155 may be spaced from each other.

The sheet support protrusion 155 may have a pillar shape having the same width at upper and lower portions or a horn shape having a width gradually decreasing toward an upper side thereof.

The sheet support protrusion 155 may be formed of a light transmitting material equal to that of the resin layer 140. The sheet support protrusion 155 prevents spots from occurring. The sheet support protrusion 155 may be integrated with the resin layer 140. Alternatively, the sheet support protrusion 155 may be fixed to a board 121 or a bottom surface of the bottom cover 110. The resin layer 140 supports a lower portion of the sheet support protrusion 155. The sheet support protrusion 155 may be formed of a light reflective material.

A fixing groove 114 may be defined in a sidewall 112 and/or the bottom surface of the bottom cover 110. The fixing groove 114 may have an inside region greater than an opened inlet region. The fixing groove 114 may be provided in plurality in the sidewall 112 and/or the bottom surface of the bottom cover 110, but is not limited thereto. Also, the fixing groove 114 defined in the bottom surface of the bottom cover 110 may be defined between the board 121 and the sidewall 112 of the bottom cover 110. The fixing groove 114 may be formed of a concave portion in an inner surface of bottom cover 110.

The fixing groove 114 may be defined at a position lower than that of a top surface of the resin layer 140. The fixing groove 114 is a groove defined in the bottom cover 110. A portion of the resin layer 140 may be filled into the fixing groove 114 or be formed with a resin material.

The fixing groove 114 may prevent the resin layer 140 from being separated from the bottom cover 110 after the resin layer is cured. Although the fixing groove 114 is described as an example in the embodiment, a fixing protrusion protruding from the bottom surface or the sidewall 112 of the bottom cover 110 may be provided to support the resin layer 140.

Figure 3:
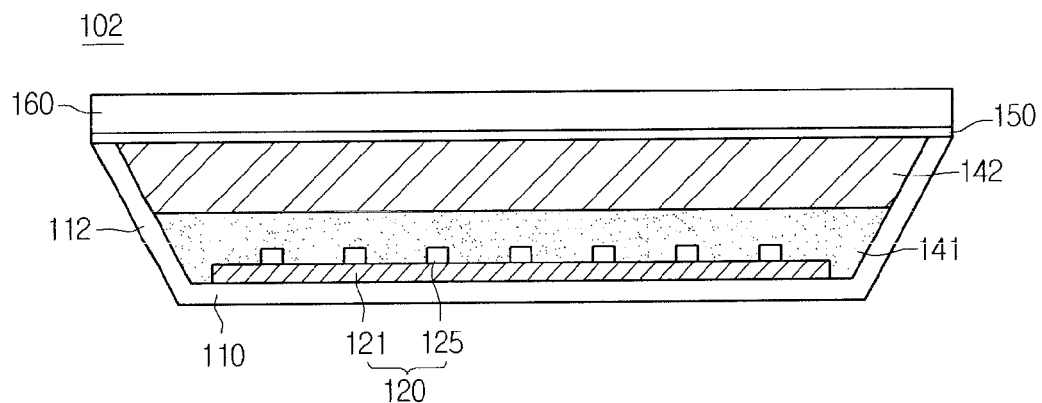
FIG. 3 is a sectional view of a display device according to a third embodiment.

FIG. 3 is a sectional view of a display device according to a third embodiment. In description of a third embodiment, the same construction as that of first embodiment will be described with reference to the first embodiment, Referring to FIG. 3, a display device 102 includes a plurality of resin layers 141 and 142 stacked on a bottom cover 110. The first resin layer 141 may have a first thickness on a light emitting module 120 and the bottom cover 110, and second resin layer 142 may have a second thickness on the first resin layer 141. The first thickness may be different from the second thickness, but is not limited thereto.

Each of the first resin layer 141 and the second resin layer 142 may have one or more kinds of a transparent material particle. The transparent material particle is a particle having a refractive index greater than that of the resin, e.g., a refractive index of about 1.5 or more. For example, the transparent material particle may be formed of one of GaP (n=3.5), Si (n=3.4), TiO$_2$ (n=2.9), SrTiO$_3$ (n=2.5), SiC (n=2.7), cubic or amorphous carbon (n=2.4), carbon nano-tube (n=2.0), ZnO (n=2.0), AlGaInP (n=3.4), AlGaAs (n=2.8~3.2), SiN (n=2.2~2.3), SiON (n=2.2), ITO (n=1.8~1.9), SiGe (n=2.8~3.2), AlN (n=2.2), and GaN (n=2.4).

The transparent material particle may be selectively added to the first resin layer 141 or the second resin layer 142 so that the first and second resin layers 141 and 142 have refractive indexes different from each other. For example, when the transparent material particles may be added to the first resin layer 141, the second resin layer 142 may have a refractive index less than that of the first resin layer 141. The refractive index may be decreased in order from the first resin layer 141 to the second resin layer 141. Light emitted from a light emitting diode 125 passes through the first resin layer 141 and is emitted to the outside through the second resin layer 142.

Each of the first resin layer 141 and the second resin layer 142 may be formed of a light transmitting material. Also, the first and second resin layers 141 and 142 may have densities different from each other, but is not limited thereto.

Also, a phosphor may be added to the first resin layer 141 or/and the second resin layer 142. For example, the phosphor is added to the first resin layer 141 to convert a wavelength of a portion of light emitted from the light emitting diode 125.

When the first resin layer 141 and the second resin layer 142 are disposed, a light guide plate may be removed. Also, a space on the light emitting diode may be reduced.

Figure 4:
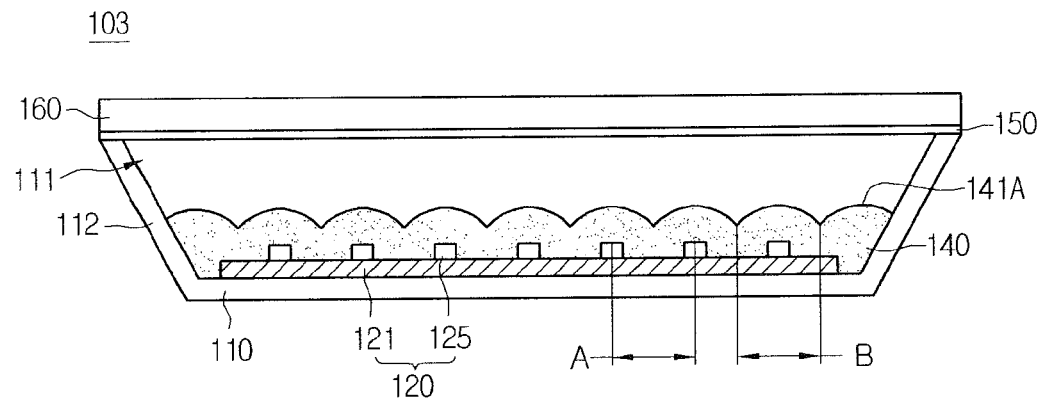
FIG. 4 is a sectional view of a display device according to a fourth embodiment.

FIG. 4 is a sectional view of a display device according to a fourth embodiment. In description of a fourth embodiment, the same construction as that of first embodiment will be described with reference to the first embodiment, and their duplicated descriptions will be omitted.

Referring to FIG. 4, a display device 103 includes a resin layer 140 having a lens array shape. The resin layer 140 has a top surface 140A having the lens array shape. For example, in the lens array shape, convex portions having a predetermined period may be arrayed in a matrix or strip shape. A distance B between the convex portions may be equal to a distance A between light emitting diodes 125. The distance B between the convex portions may be varied according to orientation angle distribution of the light emitting diodes 125. Here, one or plurality of light emitting diodes 125 may be disposed in a region of each of the convex portions, but is not limited thereto.

Alternatively, the top surface of the resin layer may have a rough surface on which uneven protrusions protrude, but is not limited thereto.

Here, a boundary line between the convex portions may be disposed between the light emitting diodes 125. The distance between the convex portions may be varied according to light extraction efficiency and light distribution. Also, the distance B between the convex portions and the distance A between the light emitting diodes 125 may have the same period as each other at a starting point of the light emitting diode 125, but is not limited thereto. For another example, although the plurality of convex portions is described for the lens array shape an example, the convex portions and concave portions may be alternately arranged.

An optical sheet may be disposed or removed between a display panel 160 and the resin layer 140, but is not limited thereto. For example, when light is uniformly distributed on the entire region of the resin layer 140, a diffusion sheet may be removed.

Figure 5:
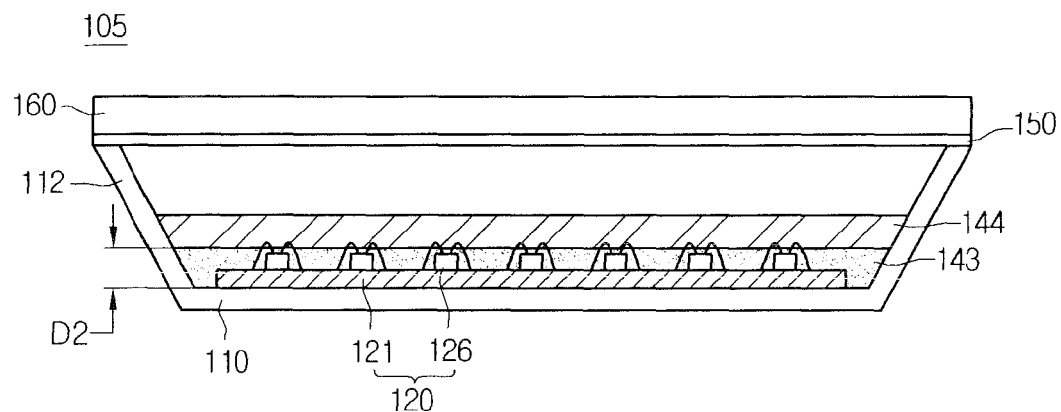
FIG. 5 is a sectional view of a display device according to a fifth embodiment.

FIG. 5 is a sectional view of a display device according to a fifth embodiment. In description of a fifth embodiment, the same construction as that of first embodiment will be described with reference to the first embodiment, and their duplicated descriptions will be omitted.

Referring to FIG. 5, a display device 105 includes a light emitting module 120 including a light emitting diode 126 and a board 121, and a plurality of resin layers 143 and 144 on the light emitting module 120.

The light emitting diode 126 is mounted on the board 121 in a chip type. Also, the light emitting diode 126 is electrically connected to a pad of the board 121 using at least one wire 129. That is, a COB type light emitting diode may be provided.

A first resin layer 143 is disposed on the light emitting module 120 and a bottom cover 110. The first resin layer 143 may have a thickness D2 less than a height of an upper end of the wire 129. For example, a top surface of the first resin layer 143 may be disposed at a position higher than that of the light emitting diode 126 and lower than that of the highest point of the wire 129. Since the first resin layer 143 may have a thickness greater than that of the light emitting diode 126, it may prevent a bonded portion of the wire 129 from being separated.

Here, the first resin layer may be formed of a material having a relatively high viscosity of silicon and epoxy to enhance the bonded portion of the wire 129.

The second resin layer 144 may be disposed on the first resin layer 143. Also, the second resin layer 144 may be disposed before the first resin layer is cured or completely cured.

The second resin layer 144 may have a thickness which the wire 129 is not exposed. The total thickness of the first resin layer 143 and the second resin layer 144 may be about 100 µm or more, but is not limited thereto.

A phosphor and/or diffuser may be added to at least one of the first resin layer 143 and the second resin layer 144.

Figure 6:
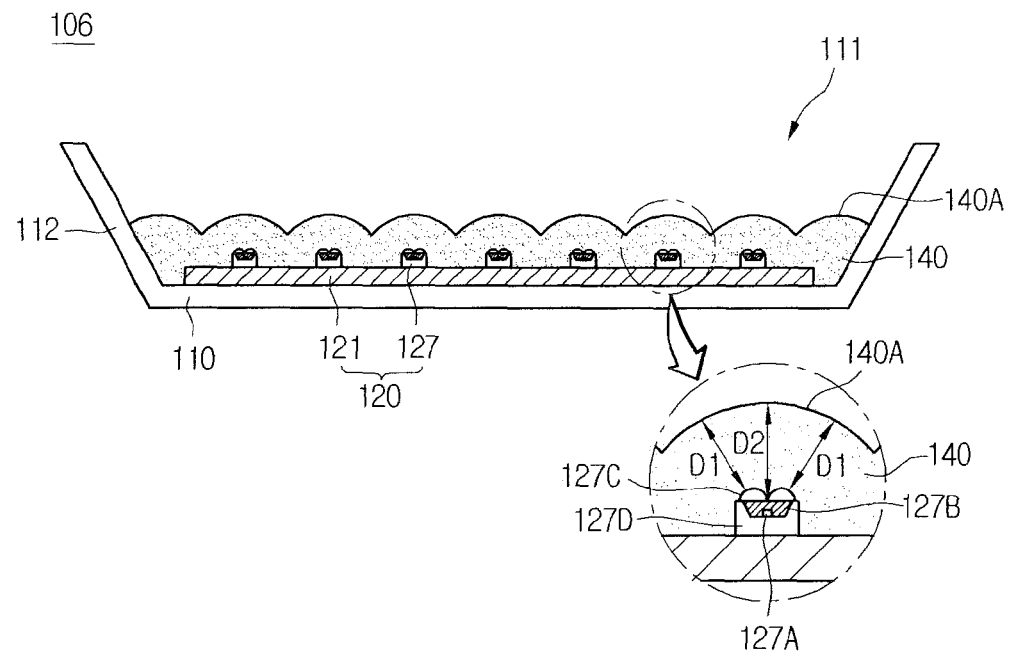
FIG. 6 is a sectional view illustrating a lighting unit of a display device according to sixth embodiment.

FIG. 6 is a sectional view illustrating a lighting unit of a display device according to sixth embodiment. In description of a sixth embodiment, the same construction as that of first embodiment will be described with reference to the first embodiment, and their duplicated descriptions will be omitted.

Referring to FIG. 6, a display device 106 includes a light emitting diode 127 and a resin layer 140 having a top surface 140A with a lens array shape.

The resin layer 140 may be disposed on a board 121. The top surface of the resin layer 140 may have a convex lens array shape. A convex portion of the lens array shape may correspond to the light emitting diodes 127.

In the light emitting diode 127, a LED chip 127A and a resin material 128B are disposed within a body 127D, and a lens part 127C is disposed on the body 127D.

The lens part 127C of the light emitting diode 127 has a central portion recessed in a direction in which the LED chip 127A is disposed. A convex shape may be arranged around the central portion. The lens part 127C may have a structure in which the central portion having a hemisphere shape is recessed.

A distance D2 between the central portion of the lens part 127C and the top surface 140A of the resin layer 140 may be greater than that D1 between the highest point of the lens part 127C and the top surface 140A of the resin layer 140.

Since the central portion of the lens part 127C of the light emitting diode 127 is recessed in the chip direction, the distances D1 and D2 may be differently arranged. Light emitted from the light emitting diode 127 has a wide orientation angle by the lens part 127, e.g., distribution of about 150° or more and is incident into the resin layer 140. The resin layer 140 reflects or refracts the light transmitting the lens part 127C of the light emitting diode 127 to irradiate light having uniform distribution.

Figure 7:
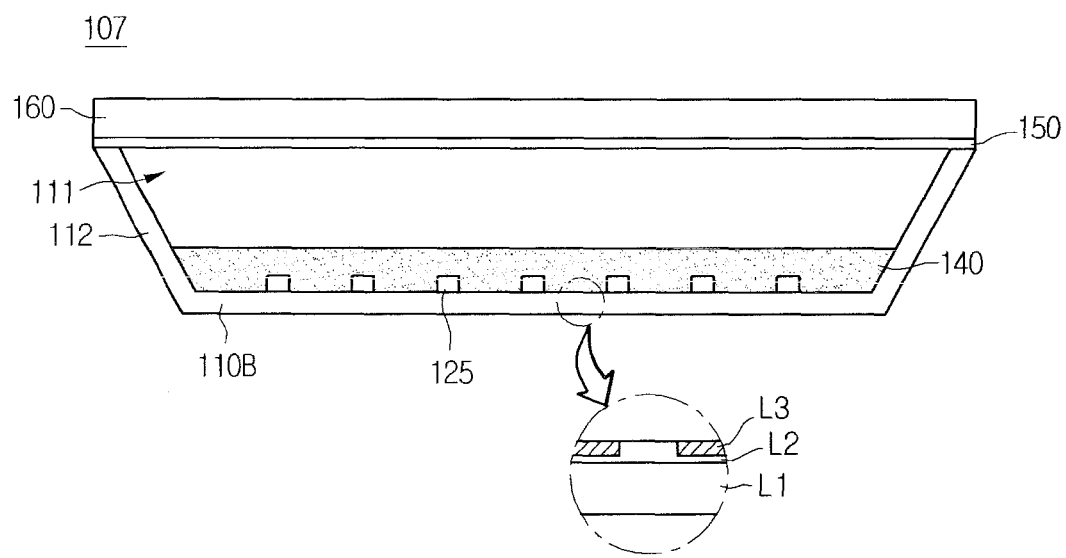
FIG. 7 is a sectional view of a display device according to a seventh embodiment.

FIG. 7 is a sectional view of a display device according to a seventh embodiment. In description of a seventh embodiment, the same construction as that of first embodiment will be described with reference to the first embodiment, and their duplicated descriptions will be omitted.

Referring to FIG. 7, a display device 107 includes a light emitting diode 125 mounted on a bottom cover 110B. That is, a light emitting module 120 includes the light emitting diode 125 and the bottom cover 110B.

For example, the bottom cover 110B may include a metal core board (MCPCB). In the bottom cover 110B, an insulation layer L2 is disposed on a metal layer L1, and an electrode pattern L3 is disposed on the insulation layer L2. The metal layer L1 may be formed of a metal material such as AL, Cu, or Ag and supports the whole backlight unit. The electrode pattern L3 may have the same pattern as that of a pad disposed on a board. The light emitting diode 125 is mounted on the electrode pattern L3, and the electrode pattern L3 is electrically connected to the light emitting diode 125.

The light emitting diode 125 may be mounted on the bottom cover 110B in a chip type or package type. The bottom cover 110B together with a board may serve as a cover. Thus, the board as shown in FIG. 1 may be removed.

The metal layer L1 having high heatsink efficiency may be disposed under the bottom cover 110B to effectively release heat emitted from the light emitting diode 125 through the metal layer L1.

A resin layer 140 may be disposed on the bottom cover 110B and the light emitting diode 125. The resin layer 140 may have a thickness of about 100 µm or more on the bottom cover 110B.

The resin layer 140 may selectively contain a phosphor, a disperser, and a transparent material particle, but is not limited thereto.

Figure 8:
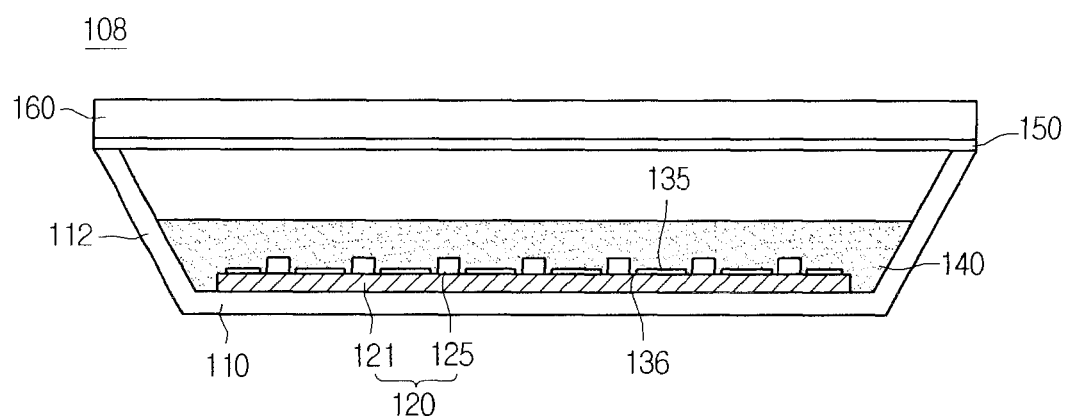
FIG. 8 is a sectional view of a display device according to an eighth embodiment.

FIG. 8 is a sectional view of a display device according to an eighth embodiment. In description of an eighth embodiment, the same construction as that of first embodiment will be described with reference to the first embodiment, and their duplicated descriptions will be omitted.

Referring to FIG. 8, a display device 108 includes a plurality of light emitting diodes 125 on a board 121. A reflective sheet 135 is disposed around each of the light emitting diodes 125. Since a plurality of holes 136 is defined in the reflective sheet 135, the light emitting diodes 125 separately protrude or protrude by a group unit. A disperser may be coated on a surface of the reflective sheet 135, but is not limited thereto.

A resin layer 140 may extend through the holes 136 of the reflective sheet 135 to adhere to the board 121, thereby preventing the reflective sheet 135 from coming off the board 121.

The resin layer 140 may integrally molded with a bottom cover and a light emitting module to improve light extraction efficiency.

The reflective sheet 135 may reflect light emitted from the light emitting diodes 125 when the light proceeds in a direction of the bottom cover 110. Thus, light extraction efficiency within the bottom cover 110 may be improved.

Figure 9:
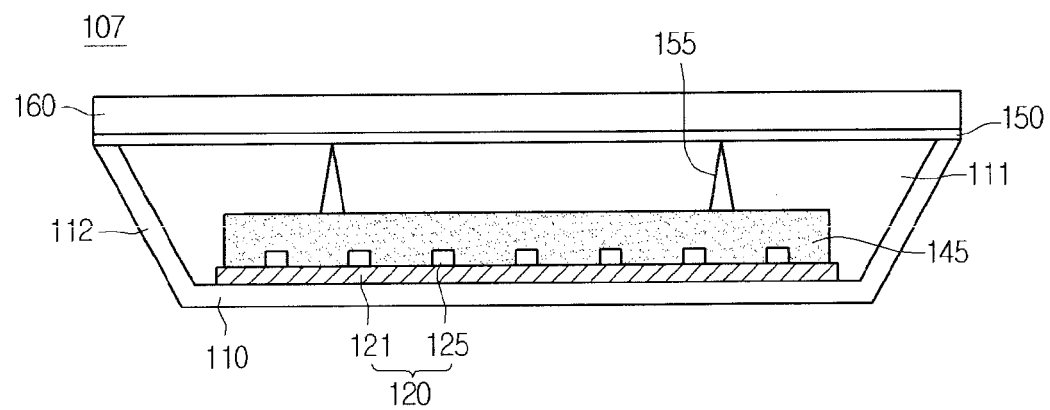
FIG. 9 is a sectional view of a display device according to a ninth embodiment.
Figure 10:
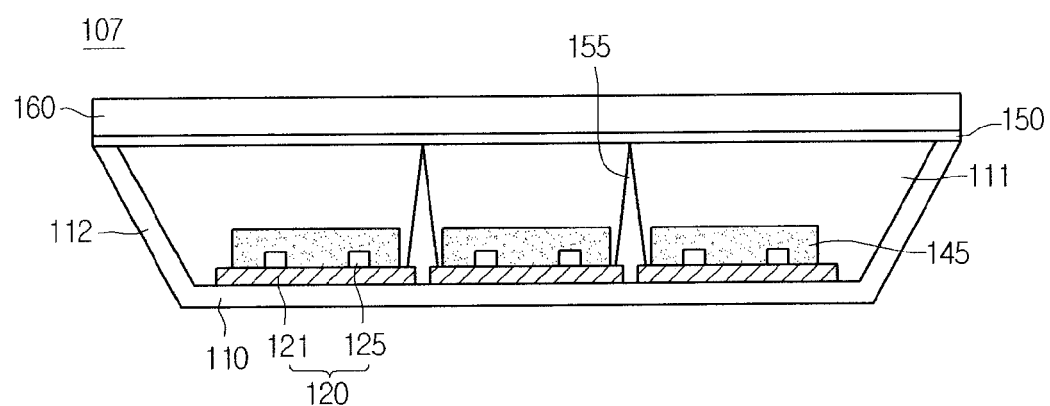
FIG. 10 is a sectional view illustrating another example of the display device of FIG. 9.

FIG. 9 is a sectional view of a display device according to a ninth embodiment, and FIG. 10 is a sectional view illustrating another example of the display device of FIG. 9.

Referring to FIGS. 9 and 10, a display device 107 includes a bottom cover 110, light emitting modules 120, a resin layer 145, an optical sheet 150, and a display panel 160.

The bottom cover 110 may be formed of a metallic material. For example, the bottom cover 110 may be formed of one of Al, Mg, Zn, Ti, Ta, Hf, and Nb.

The plurality of light emitting modules 120 are arranged on the bottom cover 110. The plurality of light emitting modules 120 may be arranged in an M×N matrix (M>1, N>1) on a bottom surface of the inside of the bottom cover 110.

A recess portion 111 and at least one sidewall 112 around the recess portion 111 are disposed inside the bottom cover 110. Here, the sidewall 112 may be vertically disposed with respect to a bottom surface of the bottom cover 110. Also, the bottom cover 110 and the sidewall 112 may be formed of materials different from each other, but is not limited thereto. A reflective material (e.g., Ag) may be further coated on an inner surface of the bottom cover 110.

The light emitting module 120 includes a board 121 and a plurality of light emitting diodes 125. The board 121 may include one of a single layer PCB, a multi-layer PCB, a ceramic board, and a metal core PCB. A predetermined wiring pattern (not shown) or plated pattern may be disposed on the board 121 to supply a power, but is not limited thereto.

The plurality of light emitting diodes 125 may be mounted on the board 121. The light emitting diodes 125 may be mounted on the board 121 in a chip of board (COB) type or a package of board (POB) type.

The plurality of light emitting diodes 125 may be arranged on the board 121 in a transverse direction and/or in a longitudinal direction to form an array structure. Alternatively, the plurality of light emitting diodes 125 may be arranged in a matrix or zigzag shape, and this arrangement shape may be changed according to a size of the board 121.

The plurality of light emitting diodes 125 may be arranged on the board 121 with a predetermined distance, but is not limited thereto.

Each of the light emitting diodes 125 may include at least one of a blue LED, a green LED, a red LED, and an ultraviolet (UV) LED.

The resin layer 145 is disposed on the board 121. The resin layer 145 may be formed a transparent resin such as silicon or epoxy. The resin layer 145 may have a predetermined thickness to improve light efficiency and light distribution. For example, the resin layer 145 may have a thickness of about 100 μm or more from a top surface of the board 121 or greater than that of the light emitting diode 125. The resin layer 145 may cover about 80% or more of the top surface of the board 121.

At least one kind of phosphor may be added to the resin layer 145. For example, at least one of a red phosphor, a green phosphor, a blue phosphor may be added to the resin layer 145, but is not limited thereto.

Since the resin layer 145 is molded on the board 121, it may prevent a copper foil pattern exposed to the surface of the board 121 from being oxidized or prevent moisture from being permeated.

The board 121 may be fixed to the bottom surface of the bottom cover 110 using a coupling member such as an adhesive and a screw.

The resin layer 145 may have a flat top surface. A light transmittance may be adjusted according to a thickness and material of the resin layer 145. The thickness and material of the resin layer 145 may be changed within a technical range of the present embodiment.

In the current embodiment, a photo luminescent film (PLF) may be disposed between the resin layer 145 and a diffusion sheet 150 or a display panel 160. The PLF converts a portion of light emitted from the light emitting diode 125 into light having a different wavelength.

The resin layer 145 is molded on the board 121 with a uniform thickness to serve as a light guide plate. Also, an air gap between the board 121 and the light emitting diode 125 may be removed to improve light extraction efficiency. A fixing protrusion such as a hook protrusion or a screw may be disposed on the board 121. The fixing protrusion may be coupled to the resin layer 145. Also, the fixing protrusion may prevent the resin layer 145 from being separated from the board 121.

A sheet support protrusion 155 may be disposed on the board 121 to support an optical sheet 150. As shown in FIG. 10, the sheet support protrusion 155 may be coupled to the board 121 and/or a bottom surface of the bottom cover 110. The sheet support protrusion 155 may have a height enough to prevent the optical sheet 150 from drooping down.

A lower end coupling structure of the sheet support protrusion 155 may be coupled using a coupling member such as a screw, a hook, a hook protrusion, but is not limited thereto. Here, the sheet support protrusion 155 integrally protrudes from the resin layer 145, but is not limited thereto.

An outer portion of the sheet support protrusion 155 may be formed of a material such as a reflective material or transmissive material. The sheet support protrusion 155 may have a hone shape or a pillar shape, but is not limited thereto. For another example, the sheet support protrusion 155 may be disposed on the board 121, but is not limited thereto.

For another example of FIG. 10, the resin layers 145 of each of the boards 121 may be connected to each other using a connection part. Since the resin layers 145 disposed on two boards 121 adjacent to each other are connected to each other, it is unnecessary to separately adjust a distance between the connection part of the resin layer 145 and each of the boards 121. Thus, the boards 121 may be simply coupled to each other.

Figure 11:
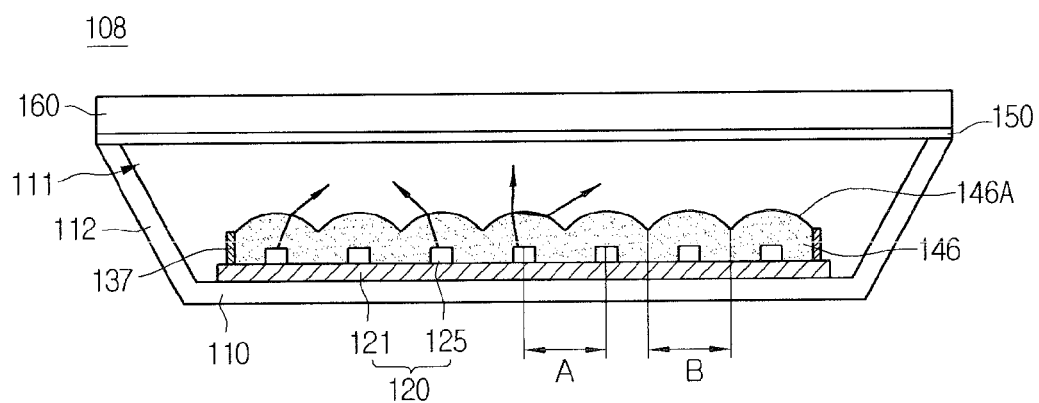
FIG. 11 is a sectional view of a display device according to a tenth embodiment.

FIG. 11 is a sectional view of a display device according to a tenth embodiment. In description of a tenth embodiment, the same construction as that of first embodiment will be described with reference to the first embodiment, and their duplicated descriptions will be omitted.

Referring to FIG. 11, a display device 108 includes a resin layer 146 having a top surface 141A with a lens array shape.

In the lens array shape, convex portions having a predetermined period may be arrayed in a matrix or strip shape. A distance B between the convex portions may be equal to a distance A between light emitting diodes 125. The distance B between the convex portions may be varied according to orientation angle distribution of the light emitting diodes 125. Here, one or plurality of light emitting diodes 125 may be disposed in a region of each of the convex portions, but is not limited thereto.

Here, a boundary line between the convex portions may be disposed between the light emitting diodes 125. The distance between the convex portions may be varied according to light extraction efficiency and light distribution. Also, the distance B between the convex portions and the distance A between the light emitting diodes 125 may have the same period as each other at a starting point of the light emitting diode 125, but is not limited thereto.

An optical sheet may be disposed or removed between a display panel 160 and the resin layer 146, but is not limited thereto. For example, when light is uniformly distributed on the entire region of the resin layer 146, a diffusion sheet may be removed.

A reflective layer 137 may be further disposed on a side surface of the resin layer 146. The reflective layer 137 may reflect light leaking to the outside.

Figure 12:
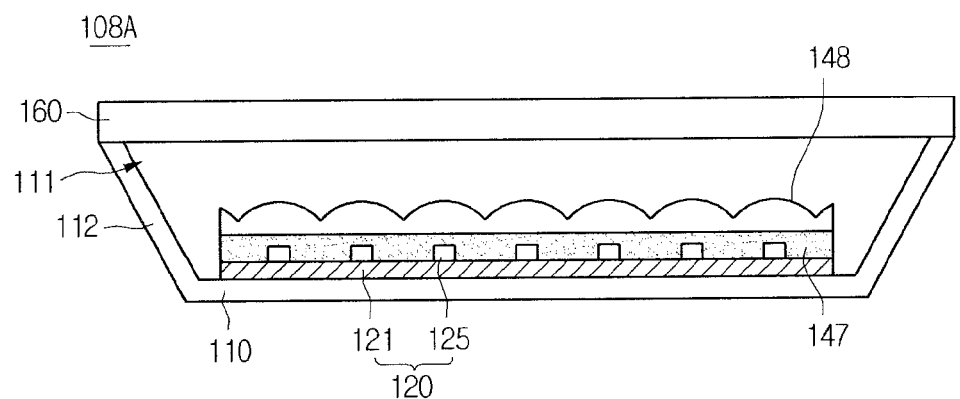
FIG. 12 is a sectional view of a display device according to an eleventh embodiment.

FIG. 12 is a sectional view of a display device according to an eleventh embodiment. In description of an eleventh embodiment, the same construction as that of first embodiment will be described with reference to the first embodiment.

Referring to FIG. 12, a display device 108A includes a plurality of resin layers 142 and 144 stacked on a bottom cover 110. The first resin layer 142 may be disposed with a uniform thickness on a board 121 of a light emitting module 120. The second resin layer 144 may have a convex lens array shape on the first resin layer 142.

Each of the first resin layer 142 and the second resin layer 144 may have one or more kinds of a transparent material particle. The transparent material particle is a particle having a refractive index greater than that of the resin, e.g., a refractive index of about 1.5 or more. For example, the transparent material particle may be formed of one of GaP (n=3.5), Si (n=3.4), TiO$_2$ (n=2.9), SrTiO3 (n=2.5), SiC (n=2.7), cubic or amorphous carbon (n=2.4), carbon nano-tube (n=2.0), ZnO (n=2.0), AlGaInP (n=3.4), AlGaAs (n=2.8~3.2), SiN (n=2.2~2.3), SiON (n=2.2), ITO (n=1.8~1.9), SiGe (n=2.8~3.2), AlN (n=2.2), and GaN (n=2.4).

The transparent material particle may be selectively added to the first resin layer 142 or the second resin layer 144 so that the first and second resin layers 142 and 144 have refractive indexes different from each other. For example, when the transparent material particles may be added to the first resin layer 142, the second resin layer 144 may have a refractive index less than that of the first resin layer 142. The refractive index may be decreased in order from the first resin layer 142 to the second resin layer 144. Light emitted from a light emitting diode 125 passes through the first resin layer 141 and is emitted to the outside through the second resin layer 144.

The first resin layer 142 and the second resin layer 144 may be formed of materials having densities different from each other, but is not limited thereto.

Also, a phosphor may be added to the first resin layer 142 or the second resin layer 144. For example, the phosphor is added to the first resin layer 142 to convert a wavelength of a portion of light emitted from the light emitting diode 125.

When the first resin layer 142 and the second resin layer 144 are disposed, a light guide plate may be removed. Also, an air gap between the board 121 and the first resin layer 142 may be reduced.

The second resin layer 144 may have a flat top surface or a convex lens array shaped top surface. The top surface of the second resin layer 144 may be changed in shape to adjust light uniformity.

At least one kind of a phosphor and disperser may be selectively added to at least one layer of the first resin layer 142 and the second resin layer 144.

The first resin layer 142 may have a thickness enough to cover the light emitting diode 125 or less than a height of an upper end of a wire of the light emitting diode 125. Thus, the thickness of the first resin layer may enhance an adhesive force of the wire.

A photo luminescent film (PLF) or lens may be disposed on the light emitting module according to the embodiments, but is not limited thereto.

Figure 13:
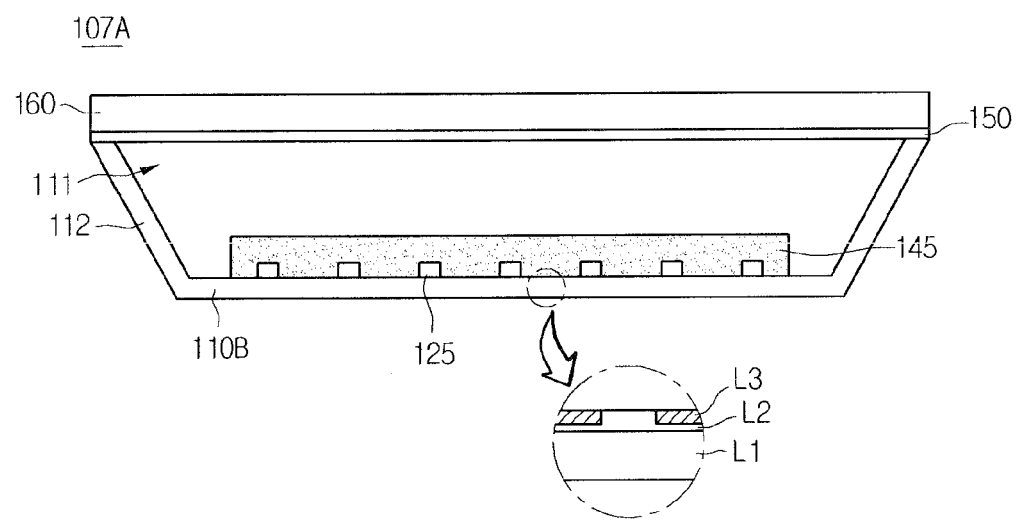
FIG. 13 is a sectional view of a display device according to a twelfth embodiment.

FIG. 13 is a sectional view of a display device according to a twelfth embodiment. In description of a twelfth embodiment, the same construction as that of first embodiment will be described with reference to the first embodiment, and their duplicated descriptions will be omitted.

Referring to FIG. 13, a display device 107A has a structure in which a light emitting diode 125 is mounted on a bottom cover 110B. A light emitting module includes the light emitting diode 125 and the bottom cover 110B having a pattern.

For example, the bottom cover 110B may include a metal board such as a metal core board (MCPCB). In the bottom cover 110B, an insulation layer L2 is disposed on a metal layer L1, and an electrode pattern L3 is disposed on the insulation layer L2. The metal layer L1 may be formed of a metal material such as AL, Cu, or Ag and supports the whole backlight unit. The electrode pattern L3 may have the same pattern as that of a pad disposed on a board. The electrode pattern L3 is electrically connected to the light emitting diode 125.

The light emitting diode 125 may be mounted on the bottom cover 110B in a chip type or package type. The bottom cover 110B together with a board may serve as a cover. Thus, the board as shown in FIG. 1 may be removed.

The metal layer L1 of the bottom cover 110B may effectively release heat emitted from the light emitting diode 125 through the metal layer L1.

A resin layer 145 for covering the plurality of light emitting diodes 125 is molded on a bottom surface of the bottom cover 110B. The resin layer 145 may have a thickness of about 100 μm or more on the bottom surface of the bottom cover 110B.

The resin layer 145 may selectively contain a phosphor, a disperser, and a transparent material particle, but is not limited thereto.

Figure 14:
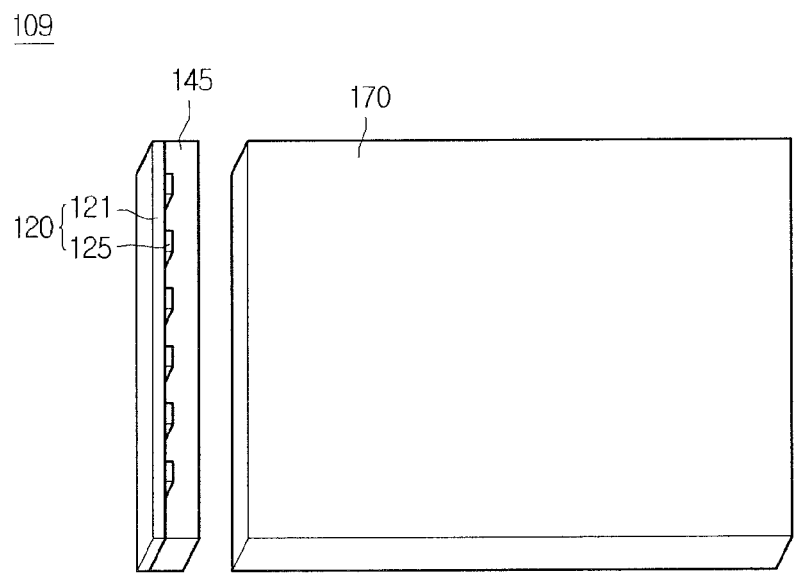
FIG. 14 is a view illustrating a lighting unit of a display device according to a thirteenth embodiment.

FIG. 14 is a view illustrating a lighting unit of a display device according to a thirteenth embodiment. In description of a thirteenth embodiment, the same construction as that of first embodiment will be described with reference to the first embodiment, and their duplicated descriptions will be omitted.

Referring to FIG. 14, a display device 104 includes a side view type lighting unit.

A light emitting module 120 include a board 121 and light emitting diodes 125 mounted on a surface of the board 121. The board 121 may be realized as a flexible board, a metal PCB, or a resin-series PCB.

A resin layer 145 is disposed on one surface of the board 121. The resin layer 145 may cover about 80% of the one surface of the board 121 to mold the plurality of light emitting diode 125.

The resin layer 145 has a light emission surface having a flat or lens shape. The resin layer 145 emits light to a side of a light guide plate 170. The light guide plate 170 guides and reflects the light incident into the resin layer 145 to the entire region to emit planar light to the light emission surface.

For example, the light guide plate 170 may be formed of an acryl-based resin (PMMA), and such a material may be changed within a technical range of the current embodiment.

The light guide plate 170 and the light emitting module 120 may be received into a bottom cover (not shown), but is not limited thereto.

The light emitting module 120 may selectively utilize the light emitting modules of the embodiments, but is not limited thereto.

Figure 15:
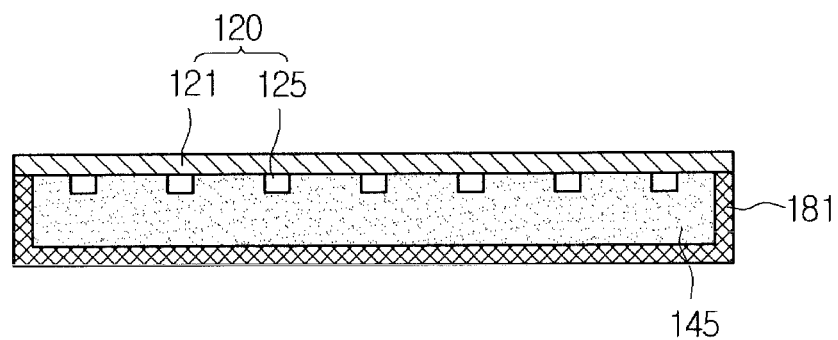
FIGS. 15 and 16 are sectional views illustrating an example of a structure in which a resin layer is disposed on a board of FIG. 9.
Figure 16:
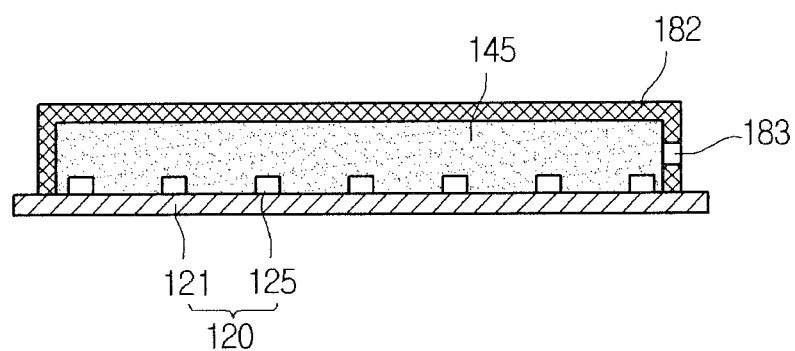

FIGS. 15 and 16 are sectional views illustrating an example of a structure in which a resin layer is disposed on a board of FIG. 9.

Referring to FIG. 15, a resin layer 145 is molded with a predetermined thickness on an injection molding structure 181. Then, a light emitting diode 125 mounted on a board 121 is compressed in a direction of the resin layer 145. In this state, the resin layer 145 is cured to separate the resin layer 145 from the injection molding structure 181.

Referring to FIG. 16, the injection molding structure 182 is closely disposed on the board 121. Then, a resin material is injected through an injection hole 183 defined in a side of the injection molding structure 182. Thereafter, the resin layer 145 is cured to separate the injection molding structure 182, thereby manufacturing a light emitting module 120.

The resin layer 145 may be integrally molded on the board 120 of the light emitting module to improve light extraction efficiency.

Figure 17:
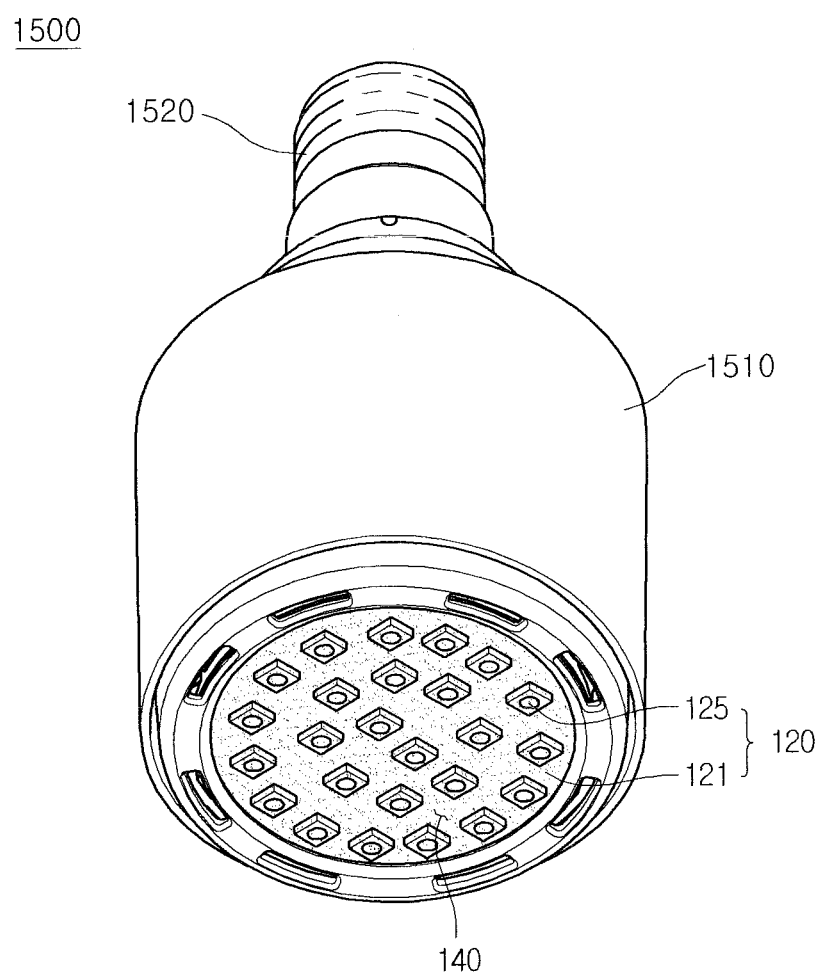
FIG. 17 is a sectional view of a lighting unit according to a fourteenth embodiment.

FIG. 17 is a sectional view of a lighting unit according to a fourteenth embodiment.

Referring to FIG. 17, a lighting unit 1500 may include a case 1510, a light emitting module 120 disposed in the case 1510, and a connection terminal 1520 disposed in the case 1510 to receive a power from an external power source.

The case 1510 may be formed of a material having an improved heat dissipation characteristic. For example, the case 1510 may be formed of a metal material or resin material.

The light emitting module 1530 may include a board 121 and a light emitting diode 125 mounted on the board 121. The light emitting diode 125 may be provided in plurality, and the plurality of light emitting diodes 125 may be arranged in a matrix shape or with a predetermined distance.

A circuit pattern may be printed on an insulation material to form the board 121. For example, the board 121 may include a printed circuit board (PCB), a metal core PCB, a flexible PCB, or a ceramic PCB.

Also, the board 121 may be formed of a material that can effectively reflect light. A surface of the board 121 may be coated with a colored material, e.g., a white or silver-colored material by which light is effectively reflected.

At least one light emitting diode 125 may be mounted on the board 121. The light emitting diode 125 may include at least one light emitting diode (LED) chip. The LED chip may include a color LED that emits red, green, blue, or white light and an UV LED that emits ultraviolet (UV) light.

The light emitting module 120 may include a plurality of light emitting device packages 125 to obtain various colors and brightness. For example, a white LED, a red LED, and a green LED may be disposed in combination with each other to secure a high color rendering index (CRI).

A resin layer 140 may be disposed on a board 121. The resin layer 140 may cover the entire region of the board 121. As shown in FIG. 1, the resin layer 140 may contact a bottom surface of a cover. The resin layer 140 may have a hemisphere shape, but is not limited thereto. For another example, a lens having a hemisphere shape may be disposed on the resin layer 140, but is not limited thereto.

The connection terminal 1520 may be electrically connected to the light emitting module 120 to supply a power. Although the connection terminal 1520 is screw-inserted into an external power source in a socket manner, the present disclosure is not limited thereto. For example, the connection terminal 1520 may have a pin shape. Thus, the connection terminal 1520 may be inserted into the external power source or connected to the external power using an interconnection.

An optical member may be disposed on the resin layer 140. The optical member may include at least one of an optical sheet or a lens.

The embodiments may reduce light losses of the lighting unit to improve the light extraction efficiency. The embodiments may remove the space between the light emitting module and the resin layer. The embodiments may provide a lighting unit without having a light guide plate. The embodiments may provide a lighting unit having the uniform color distribution. The embodiment may improve reliability of the lighting unit.

Features, structures, and effects described in the above embodiments are incorporated into at least one embodiment, but are not limited to only one embodiment. Moreover, features, structures, and effects exemplified in one embodiment can easily be combined and modified for another embodiment by those skilled in the art. Therefore, these combinations and modifications should be construed as falling within the scope of the present disclosure.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A lighting apparatus comprising:
a bottom cover having a sidewall and a recess;
a board on a bottom surface of the recess of the bottom cover;
a coupler coupled between a surface of the bottom cover and the board;

a plurality of light emitters disposed on a top surface of the board; and a light-transmitting layer over the plurality of light emitters and the board, wherein the bottom surface of the recess of the bottom cover has a first width and the board has a second width less than the first width, wherein a first portion of the light-transmitting layer extends into a space between the board and the sidewall, and wherein a size of the space corresponds to or is based on a difference between the first width and the second width, wherein each of the plurality of light emitters includes a body, an LED chip within the body, and a resin material on the LED chip within the body, wherein the sidewall of the bottom cover includes a recess, wherein a second portion of the light-transmitting layer is disposed in the recess of the sidewall, wherein the recess of the sidewall is located at a position lower than a top surface of the light-transmitting layer, wherein the resin material of each of the plurality of light emitters is disposed between the LED chip and the light-transmitting layer, wherein the first portion of the light-transmitting layer that extends into the space contacts the bottom surface of the recess of the bottom cover, and wherein the top surface of the light-transmitting layer has an area greater than the bottom surface of the recess of the bottom cover.

2. The lighting apparatus according to claim 1, wherein the top surface of the light-transmitting layer includes a rough surface.

3. The lighting apparatus according to claim 1, further comprising a reflective sheet including a plurality of holes between the board and the light-transmitting layer, and at least one of the light emitters is coupled to one of the holes of the reflective sheet.

4. The lighting apparatus according to claim 3, wherein a third portion of the light-transmitting layer extends into one or more of the holes in the reflective sheet and directly contacts the top surface of the board through the hole.

5. The lighting apparatus according to claim 1, wherein the light-transmitting layer comprises:
a first resin layer over the bottom cover; and
a second resin layer over the first resin layer, the second resin layer having a refractive index less than that of the first resin layer, wherein the first resin layer includes a first transparent material particle having a refractive index of about 1.5 or more.

6. The lighting apparatus according to claim 5, wherein the second resin layer includes a second transparent material particle having a refractive index of about 1.5 or more, and wherein the second transparent material particle is formed from one of GaP, Si, $TiO_2$, $SrTiO_3$, SiC, cubic or amorphous carbon, carbon nano-tube, ZnO, AlGaInP, AlGaAs, SiN, SiON, ITO, SiGe, AlN, or GaN.

7. The lighting apparatus according to claim 1, wherein the top surface of the light-transmitting layer has a lens array shape on which a plurality of convex portions corresponding to each of the plurality of light emitters is arrayed.

8. The lighting apparatus according to claim 1, wherein the light-transmitting layer includes at least one of a phosphor, a diffuser, or a transparent material particle having a refractive index different from that of the light-transmitting layer.

9. The lighting apparatus according to claim 1,
a lens on the resin material of each of the plurality of light emitters, wherein each of the lens includes a central portion in substantially a hemispherical shape with a recess facing towards LED chip.

10. The lighting apparatus according to claim 1, wherein the coupler includes at least one of an adhesive or a screw.

11. The lighting apparatus according to claim 1, further comprising a sheet support protrusion that protrudes higher than the top surface of the light-emitting layer and is formed in a material of the light-emitting layer.

12. The lighting apparatus according to claim 1, wherein the recess of the sidewall has an inside region that is greater than an opened inlet region.

13. The light apparatus according to claim 1, wherein the bottom cover includes a first sidewall and a second sidewall opposite to the first sidewall,
wherein the recess of the sidewall includes a first recess recessed from the first sidewall and a second recess recessed from the second sidewall,
wherein an interval between the first recess and the second recess is wider than a width of the board.

14. A lighting apparatus comprising:
a bottom cover having a bottom surface, a sidewall coupled to the bottom surface, and a recess adjacent the sidewall;
a plurality of light emitters disposed in the recess over the bottom surface of the bottom cover;
a light-transmitting layer over the light emitters; and
an optical sheet disposed over the light emitters,
wherein the bottom surface of the bottom cover includes a metal layer serving as a heat sink to dissipate heat, and
wherein the light-transmitting layer contacts the bottom surface of the bottom cover and the sidewall,
wherein each of the plurality of light emitters includes a body, an LED chip within the body, and a resin material on the LED chip within the body,
wherein each of the sidewall and the bottom surface of the bottom cover includes a recess,
wherein a portion of the light-transmitting layer is disposed in the recess of the sidewall and the bottom surface,
wherein the recess of the sidewall is at a position lower than a top surface of the light-transmitting layer,
wherein the resin material of each of the plurality of light emitters is disposed between the LED chip and the light-transmitting layer, and
wherein the light-transmitting layer includes a resin layer.

15. The lighting apparatus according to claim 14, wherein the bottom cover further includes:
an insulation layer over the metal layer; and
a plurality of electrode patterns to which the plurality of light emitting diodes are coupled, the plurality of electrode patterns being disposed over the insulation layer.

16. The lighting apparatus according to claim 14, further comprising a sheet support protrusion supporting the optical sheet, wherein the sheet support protrusion extends between two of the plurality of light emitters.

17. The lighting apparatus according to claim 14, wherein the optical sheet comprises at least one of a diffusion sheet, a prism sheet, or a photo luminescent film.

18. The lighting apparatus according to claim 14, further comprising a plurality of transparent material particles within the light-transmitting layer, each of the transparent material particles having a refractive index greater than that of the light-transmitting layer.

19. The lighting apparatus according to claim 14, wherein a portion of the light-emitting layer extends between at least one pair of light emitters.

20. A display device comprising:
a lighting apparatus comprising (a) a bottom cover having a plurality of sidewalls and a recess between the plurality of sidewalls,
(b) a board on a bottom surface of the recess of the bottom cover,
(c) a coupler between the bottom surface of the recess of the bottom cover and the board;
(d) a plurality of light emitters over the board, and
(e) a light-transmitting layer over the plurality of light emitters and the board; and
a display panel over the lighting apparatus; and
an optical sheet between the lighting apparatus and the display panel,
wherein the bottom surface of the recess of the bottom cover has a first width and the board has a second width less than the first width, wherein at least a first portion of the light-transmitting layer extends into a space between the board and the sidewall, and wherein a size of the space corresponds to or is based on a difference between the first width and the second width,
wherein each of the plurality of light emitters includes a body, an LED chip within the body, and a resin material on the LED chip within the body,
wherein each of the plurality of sidewalls of the bottom cover includes a recess,
wherein a second portion of the light-transmitting layer is disposed in the recess of each of the plurality of sidewalls,
wherein the recess of each of the plurality of sidewalls is at a lower position than a top surface of the light-transmitting layer,
wherein the resin material of each of the plurality of light emitters is disposed between the LED chip and the light-transmitting layer,
wherein the light-transmitting layer includes a resin layer, and
wherein the light-transmitting layer contacts the plurality of sidewalls and the bottom surface of the recess of the bottom cover.

* * * * *